(12) United States Patent
Chou

(10) Patent No.: US 7,661,842 B2
(45) Date of Patent: Feb. 16, 2010

(54) STRUCTURE OF A SUPPORTING ASSEMBLY FOR SURFACE MOUNT DEVICE LED AND MANUFACTURING METHOD THEREOF

(75) Inventor: Wan-Shun Chou, Taipei (TW)

(73) Assignee: I-Chiun Precision Industry Co., Ltd., Taipei (TW)

( * ) Notice: Subject to any disclaimer, the term of this patent is extended or adjusted under 35 U.S.C. 154(b) by 146 days.

(21) Appl. No.: 11/782,983

(22) Filed: Jul. 25, 2007

(65) Prior Publication Data

US 2009/0027884 A1   Jan. 29, 2009

(51) Int. Cl.
 *F21V 11/00* (2006.01)
(52) U.S. Cl. ............... 362/237; 362/235; 362/236; 362/240; 362/249.02; 362/362
(58) Field of Classification Search .......... 362/240, 362/362, 800, 235–237, 249.01–249.02; 257/98–100
See application file for complete search history.

(56) References Cited

U.S. PATENT DOCUMENTS

2005/0207165 A1* 9/2005 Shimizu et al. ........... 362/362

* cited by examiner

*Primary Examiner*—Sandra L O'Shea
*Assistant Examiner*—Meghan K Dunwiddie
(74) *Attorney, Agent, or Firm*—Kile Goekjian Reed & McManus PLLC

(57) ABSTRACT

A structure of a supporting assembly for a surface mount device LED and a manufacturing method thereof are provided. The structure of a supporting assembly comprises a plate and a substrate of LEDs. The plate has a plurality of supporting areas and a plurality of lenses each of which is respectively disposed on each supporting area. The substrate of LEDs comprises a metallic plate unit and a plurality of a surface mount device LED units each formed on the metallic plate unit. Moreover, the plate is combined with the metallic plate unit, so that each lens is respectively assembled with the corresponding surface mounting device LED unit. Via the above-mentioned structure, mass produced lenses can be assembled with and positioned on the corresponding LED units at the same time. The processes are modified and the production rate is increased.

20 Claims, 10 Drawing Sheets

STRUCTURE OF A SUPPORTING ASSEMBLY FOR SURFACE MOUNT DEVICE LED AND MANUFACTURING METHOD THEREOF

BACKGROUND OF THE INVENTION

1. Field of the Invention

The present invention relates to a design of a supporting assembly for light-emitting diodes, and in particular to a structure of a supporting assembly for a surface mount device LED and a manufacturing method thereof whereby lenses made in mass production can be assembled with and positioned on the corresponding LED units in one process.

2. Description of Prior Art

Light Emitting Diodes (LEDs) have become widely-used illumination elements because of their advantages such as zero warm-up time, rapid response, small volume, low power consumption, high intensity and long life. Therefore, LEDs are gradually replacing existing lamps and lighting elements used in traffic signs, advertising boards and backlighting modules.

In general, LEDs are formed via the processes of chip fixing, wiring and sealing in a Surface Mount Device (SMD) diode support (referred to as a lead frame), thereby forming a surface mount device LED. The procedure for manufacturing the diode support and the chip-fixing process commonly used in the industry include the following steps:

(a) Pressing process, in which a metallic plate is formed with a plurality of lead regions, and each lead region has two metallic supports that do not communicate with each other.

(b) Injection-forming process, in which an insulating plastic body is injected so that each lead region of the metallic plate is filled with a plastic body to firmly connect to the metallic support. Further, the plastic body is formed with a recessed functional region, and the metallic supports extend outwardly from the functional region to the exterior of the plastic body. In this way, a great number of surface mount device LED supports can be formed on the metallic plate.

(c) Chip-fixing process, in which each lead region of the metallic plate is firmly connected with an LED chip that is connected on the metallic support of the functional region of the plastic body.

(d) Wiring process, in which each LED chip is connected with two wires respectively, and the two wires are connected to the two metallic supports respectively.

(e) Sealing process, in which the functional region of each plastic body is filled with a transparent epoxy resin so as to cover the LED chip and the wires.

Via the above processes, a great number of surface mount device LEDs are formed on the metallic plate. These LEDs can be removed or cut off from the metallic plate easily. Therefore, these LEDs can be welded in the product that is to be assembled. In this way, mass production can be achieved. In order to make the intensity of the LEDs uniform, each LED are provided additionally thereon with a lens that is an optical element having a light-condensing effect. When the light emitted by the LED chip passes through the lens, the light can be condensed, thereby making the intensity of the LED more uniform and enhancing its intensity.

In the prior art, a number of single lenses are manufactured or bought in advance. Then, the metallic plate is fixed on a machine. A robotic arm of the machine grasps each lens to assemble the LED on the metallic plate, thereby combining both of them together. Next, an adhesive is used to adhere and attach the lens onto the LED. Finally, the LED produced by the above procedure is removed from the metallic plate, so that the LED can be assembled with a product.

The abovementioned solution allows the lens to be combined on the LED. However, assembling a single LED results in low production rates, and thus fast/mass production cannot be achieved. Therefore, the production rate (i.e., productivity) is low. Furthermore, the machine has to be precisely positioned so that the lens can be combined on the LED precisely, otherwise defective products will be generated easily, which increases the defection ratio of the manufacturing process and makes the design and operation of the machine more difficult. It goes without saying that the above drawbacks cause a lot of trouble to manufacturers and also results in a number of inconveniences throughout the manufacturing procedure.

Therefore, in view of this, the inventor proposes the present invention to overcome the above problems based on his expert experience and deliberate research.

SUMMARY OF THE INVENTION

The primary object of the present invention is to provide a structure of a supporting assembly for a surface mount device LED and a manufacturing method thereof. By forming a great number of lenses in a plate and combining the plate on the metallic plate unit of a substrate of the LED, mass produced lenses can be assembled with and positioned on the corresponding LED units at the same time. The processes are modified and the production rate is increased.

In order to achieve the above objects, the present invention provides a manufacturing method of a supporting assembly for a surface mount device LED, which includes the steps of:

providing a plate, and the plate being formed with a plurality of supporting areas;

forming a plurality of lenses that are firmly connected to each supporting area of the plate;

providing a substrate of LEDs that comprises a metallic plate unit and a plurality of surface mount device LED units each formed on the metallic plate unit; and combining the plate with the substrate of LEDs so as to combine the plate with the metallic plate unit, thereby combining the lens with the corresponding LED unit.

In order to achieve the above objects, the present invention provides a structure of a supporting assembly for a surface mount device LED, which includes a plate having a plurality of supporting areas and a plurality of lenses each located in the individual support area; and a substrate of an LED having a metallic plate unit and a plurality of surface mount device LED units each formed on the metallic plate unit, wherein the plate is combined with the metallic plate unit, so that each lens is combined with a corresponding LED unit.

The present invention has the following advantages. By forming a great number of lenses in a plate and combining the plate on the metallic plate unit of a substrate of an LED, mass produced lenses can be assembled with and positioned on the corresponding LED units at the same time. The processes are modified and the production rate is increased. Also, the defection ratio of the manufacturing procedure is substantially reduced.

In order to better understand the characteristics and the technical contents of the present invention, a detailed description thereof will be made with reference to the accompanying drawings. However, it should be understood that the drawings and the description are illustrative but not used to limit the scope of the present invention.

DETAILED DESCRIPTION OF THE INVENTION

Figure 1:
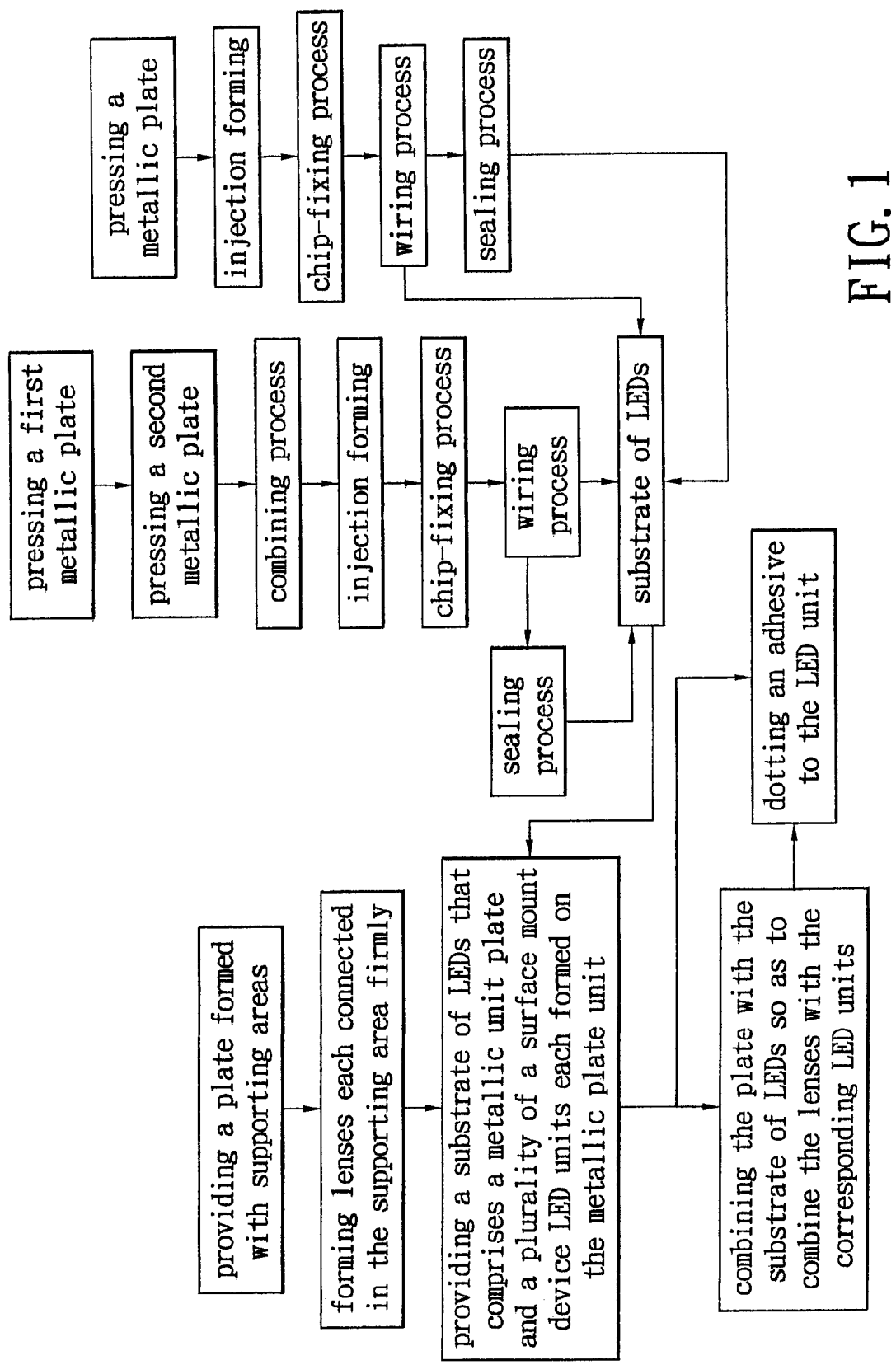
FIG. 1 is a flow chart showing the steps of the present invention.
Figure 2:
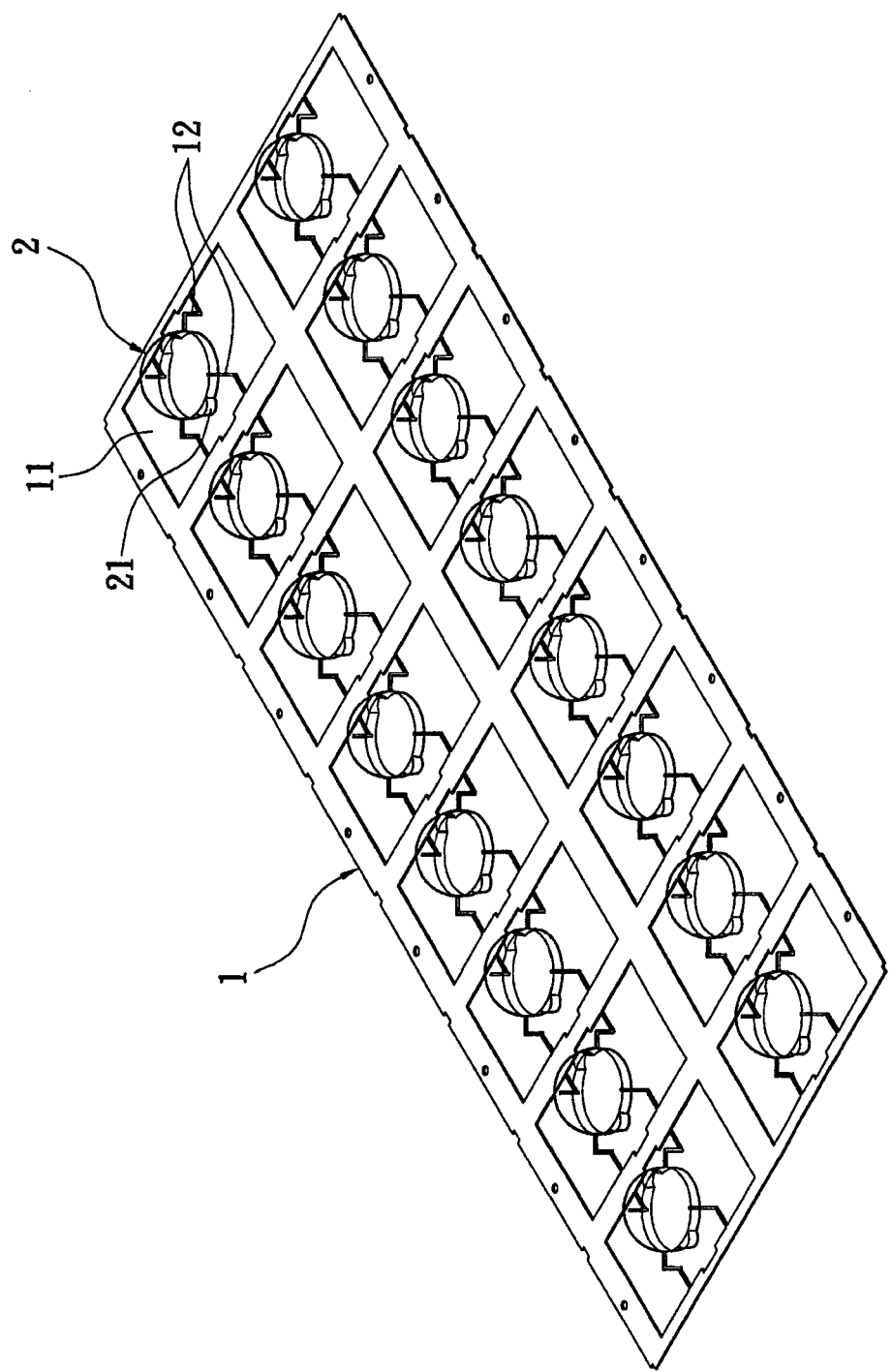
FIG. 2 is a perspective view showing the lenses formed in the plate of the present invention.
Figure 3:
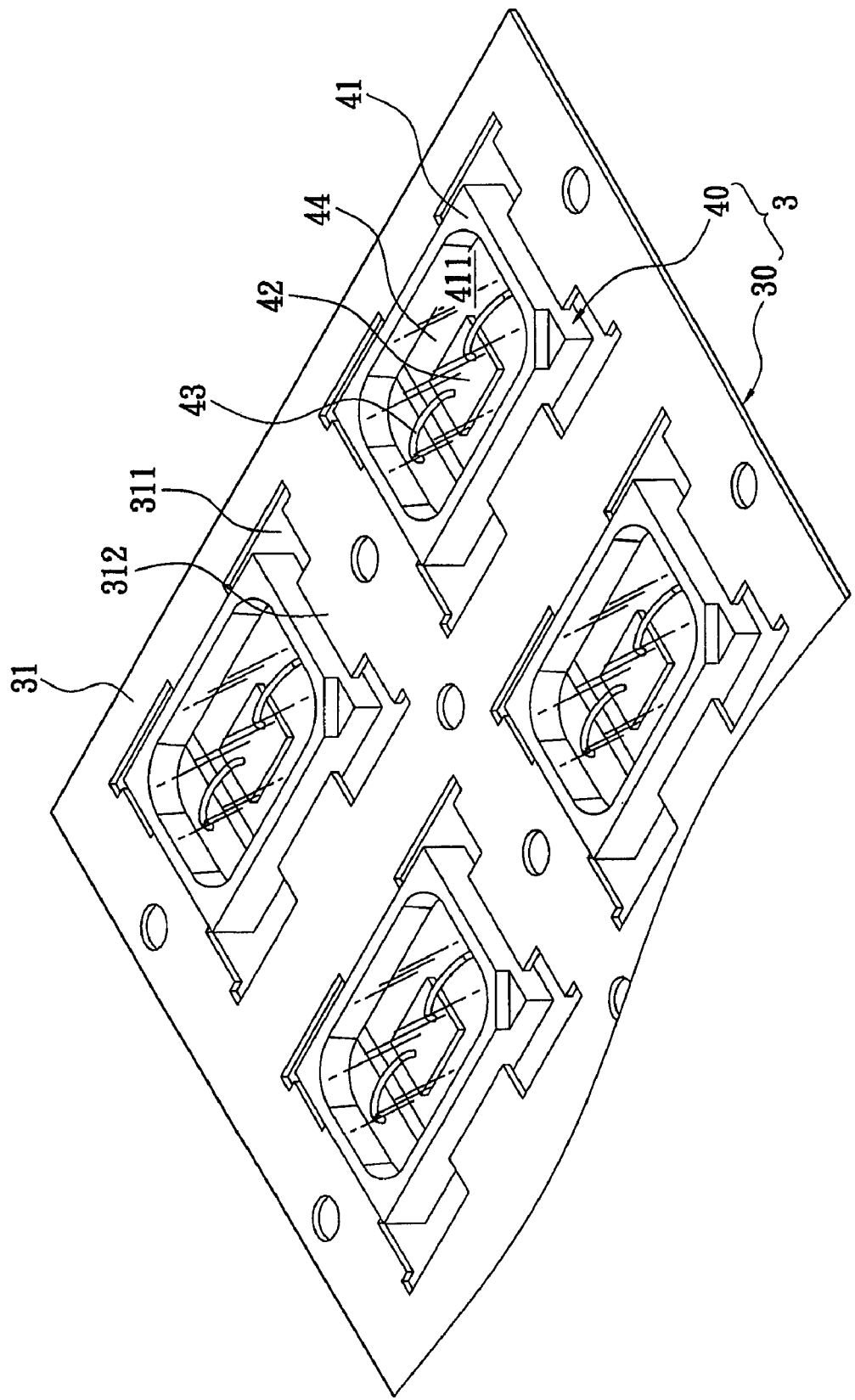
FIG. 3 is a perspective view showing the substrate of LEDs of the present invention.

Please refer to FIGS. 1 to 3. The present invention provides a structure of a supporting assembly for a surface mount device LED and a manufacturing method thereof. The manufacturing method of the present invention includes the following steps.

(A) A plate 1 is provided, the plate 1 being formed with a plurality of supporting areas 11 that are arranged at regular intervals. Each supporting area 11 is formed with supporting legs 12 that are integrally connected to the plate 1.

The plate 1 may be a metallic piece (or even a thin metallic piece) so that it can be formed with an individual supporting area 11 and the associated supporting legs 12 by means of a continuous pressing technique. Of course, the plate 1 can be made of a non-metallic material and formed with the above individual supporting area 11 and the associated supporting legs 12 by means of other processes such as an injection forming process for plastic materials. A preferred embodiment of the present invention is to use the metallic thin piece and the continuous pressing technique, thereby allowing rapid production. Each supporting leg 12 can be pressed to become bent or level. In the drawings of the present invention, the supporting leg is shown as bent.

(B) A plurality of lenses 2 is formed. The supporting legs 12 in each supporting area 11 of the plate 1 are firmly connected with a lens 2 that is an optical element having a light-condensing effect.

Each lens 2 can be firmly connected to the supporting legs 12 by means of an injection forming process. Alternatively, it can be firmly connected to the corresponding supporting legs 12 by means of a pouring process. Alternatively, the lens 2 may be solid or have a cavity (not shown) that is recessed downwardly. Further, the interior of the lens 2 is formed into a hollow body. Each lens 2 can be made of a silicon material, or other plastic materials suitable for optical members.

(C) A substrate 3 of an LED is provided, comprising a metallic plate unit 30 and a plurality of surface mount device LED units 40 each formed on the metallic plate unit 30.

The metallic plate unit 30 can be constituted by a single metallic plate via the following steps.

(I) A press-forming process in which a metallic plate 31 is formed with a plurality of lead regions 311, each lead region 311 has a metallic supporting frame 312 that does not communicate with others and is integrally connected to the metallic plate 31.

(II) An injection forming process in which an insulating plastic body 41 is injected to connect all of the metallic supports 312 firmly, one end face of each plastic body 41 is formed with a recessed functional area 411, and each metallic support 312 extends from the interior of the functional area 411 to the exterior of the plastic body 41. The material of the plastic body 41 may be polyphthalamide (PPA) or other known thermoplastic resins.

(III) A chip-fixing process in which an LED chip 42 is firmly connected in the functional area 411 of the plastic body 41 and is firmly connected on the surface of a metallic support 312. The number of LED chips 42 can be set according to practical demands, and can be one, three or so on. In this embodiment, only one LED chip is shown in the drawings.

(VI) A wiring process in which two wires 43 are connected on each LED chip 42. Further, the two wires 43 are connected to individual metallic supports 312 that do not communicate with each other.

Via the above steps, the metallic plate unit 30 has a plurality of surface mount device LED units 40. Each LED unit 40 comprises a plastic body 41, a plurality of metallic supports 312, at least one LED chip 42, and the wires 43. The metallic support 312 is formed of the metallic plate 31. Further, after the wiring process, an additional step can be performed as is described below.

(V) A sealing process, in which the functional area 411 of each plastic body 41 is filled with a transparent sealant layer 44 such as epoxy resin, silicon, or other known thermoplastic resins, thereby covering the LED chip 42 and the wires 43.

According to the above step (V), a substrate 3 of an LED can be formed, in which each LED unit 40 further includes a sealant layer 44.

Figure 4:
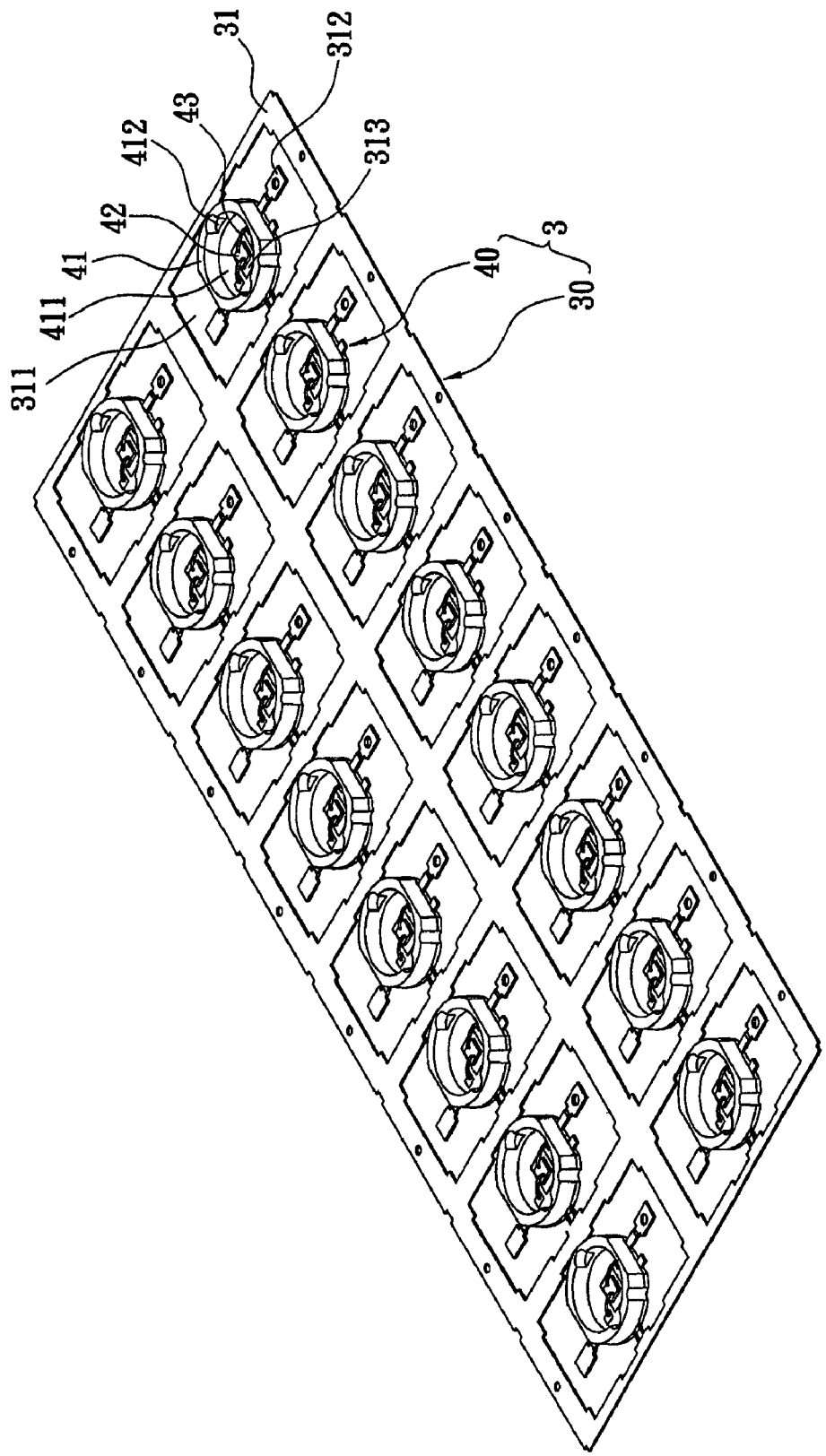
FIG. 4 is a perspective view showing the substrate of LEDs of another embodiment of the present invention.

Further, as shown in FIG. 4, the above metallic plate unit 30 can be further changed and the difference between this and the above embodiments lies in that each lead region 311 is formed with a chip-fixing base 313 and a plurality of metallic supports during the pressing process. The chip-fixing base 313 is separated from each metallic support 312 without communicating with one another. Furthermore, during the injection forming process, the plastic body 41 is simultaneously connected to the metallic supports 312 and the chip-fixing base 313 firmly. The top face of the chip-fixing base 313 is exposed in the functional area 411. The LED chip 42 is firmly connected to the top face of the chip-fixing base 313, and then the wires 43 are connected to the metallic support 312. Thereafter, the above sealing process is performed to constitute another kind of substrate 3 of LEDs.

After finishing the steps of the injection forming process, the metallic support 312 is cut off from the metallic plate unit 30 and is subjected to a bending force so that the metallic support 312 and the metallic plate unit 30 can be separated from each other. At this time, the plastic body 41 of the LED unit 40 can still be supported in the metallic plate unit 30, as shown in FIG. 4.

Figure 5:
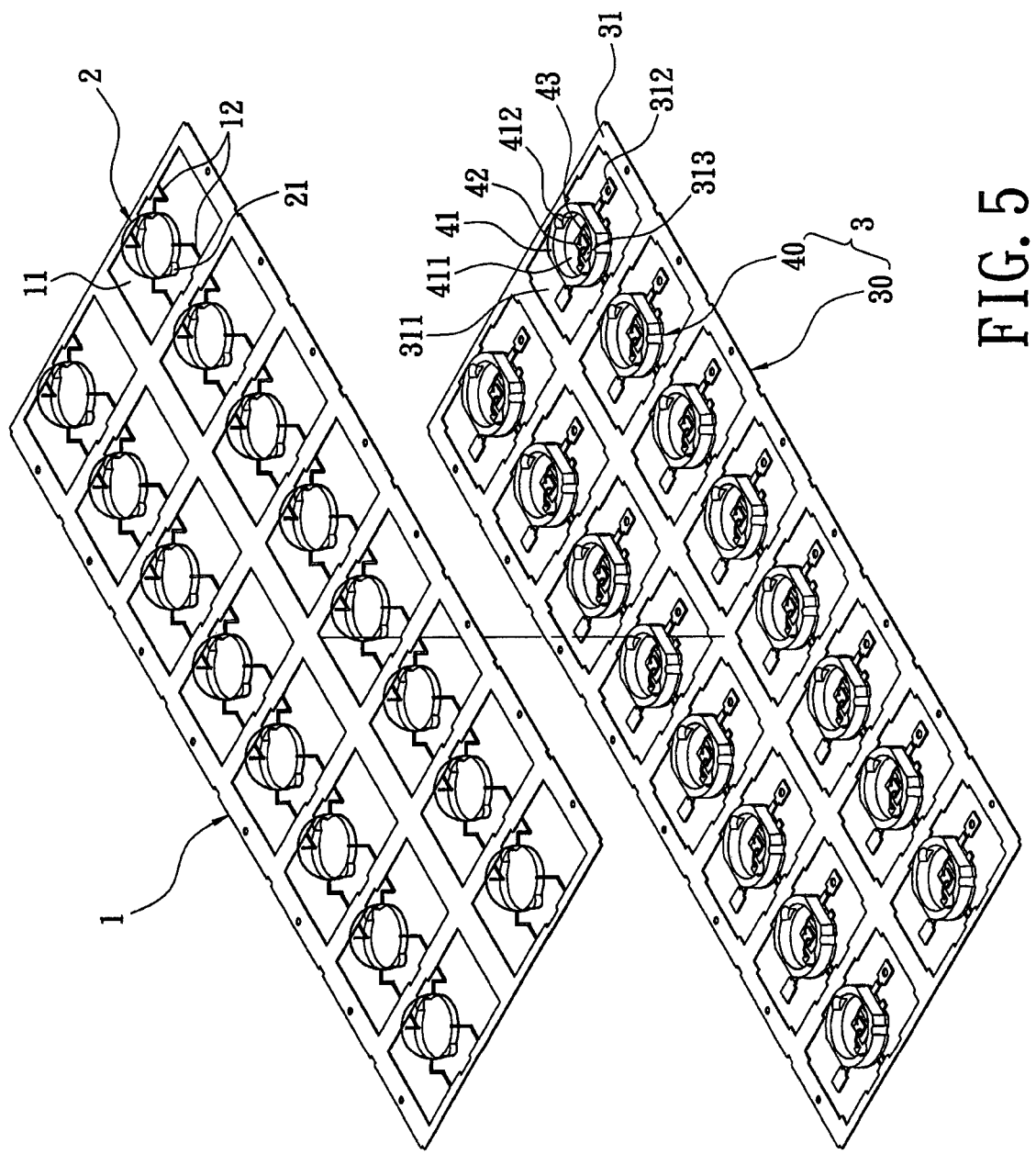
FIG. 5 is an exploded perspective view showing the plate, lenses and the substrate of LEDs of the present invention.
Figure 6:
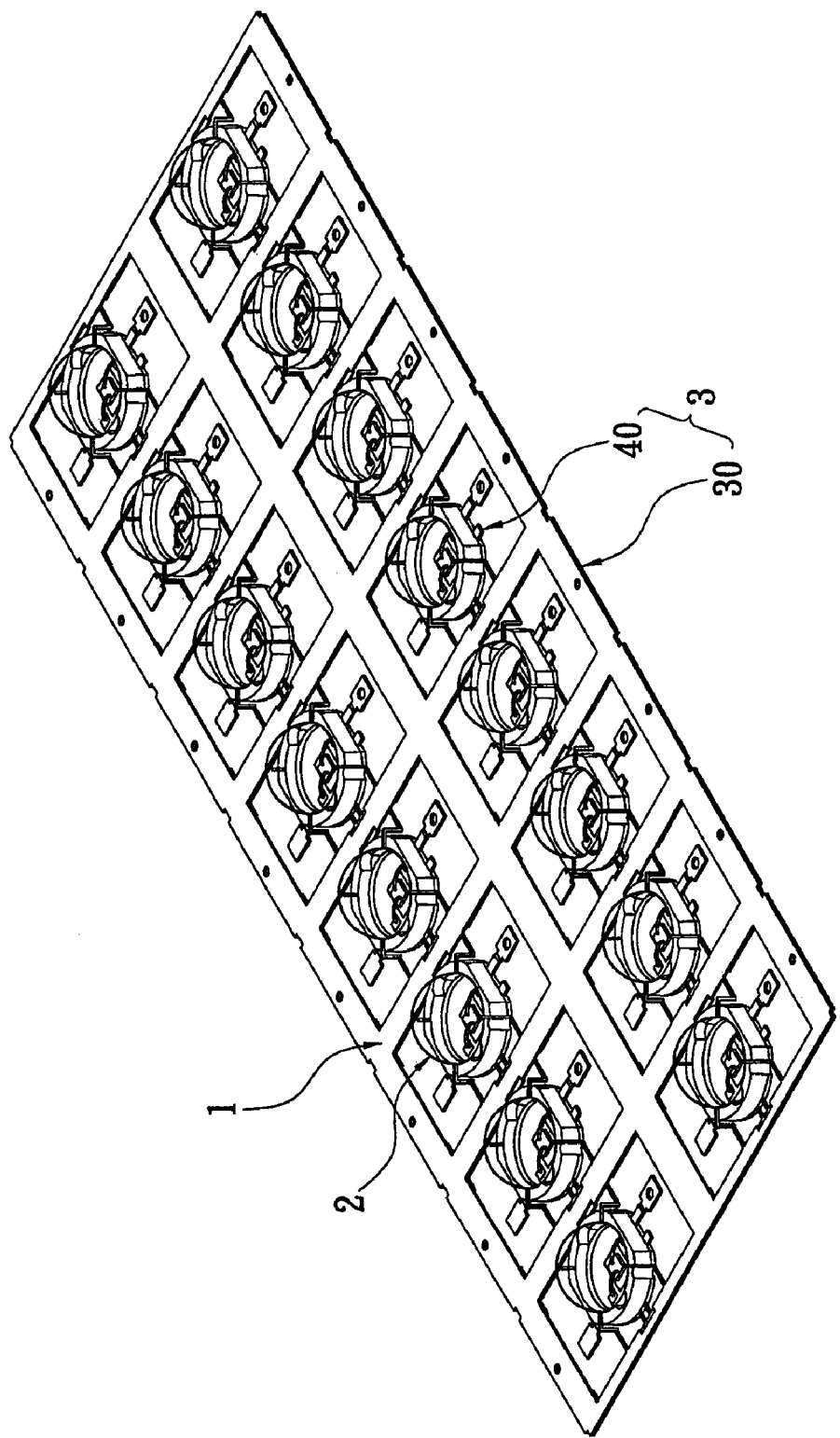
FIG. 6 is an assembled perspective view showing the plate, lenses and the substrate of LEDs of the present invention.

(D) Subsequently, as shown in FIGS. 5 and 6, the plate 1 and the substrate 3 of an LED are combined with each other in a vertical manner, so that the plate 1 is combined on the metallic plate unit 30. As a result, each lens 2 in the plate 1 can be combined on the LED chip 42 of the corresponding LED unit 40 respectively.

The plate 1 and the substrate 3 of an LED are combined by means of a mechanical pressing process so that the plate 1 and the substrate 3 of LEDs are combined with each other in a vertical manner. In order to increase the assembling and positioning effects between the plate 1 and the substrate 3 of an LED, the plate 1 and the metallic plate unit 30 of the substrate 3 of an LED are formed respectively with positioning holes and positioning protrusions (not shown) that correspond to each other.

According to the above description, when the plate 1 and the substrate 3 of an LED are combined with each other, with the positioning protrusions being engaged into the positioning holes, the plate 1 can be positioned on and assembled with the substrate 3 of LEDs firmly. As a result, each lens 2 can be precisely assembled on the LED unit 40.

Incidentally, the profile of the lens 2 can be designed according to the profile of the LED unit 40. The profile of the lens 2 shown in FIG. 2 is designed according to the profile of the LED unit 40 shown in FIG. 4. Various profiles of the lens 2 can be designed based on different profiles of the LED unit 40, such as a square or a polygon. In the present invention, the profiles of the lens 2 and the LED unit 40 are not restricted to the above profiles.

Further, with reference to FIGS. 5 and 6, the lens 2 and the LED unit 40 can be further respectively formed with a first positioning portion 21 and a second positioning portion 412 that are assembled with each other. For example, the first positioning portion 21 of the lens 2 may be a protruding block that is formed by means of extending from the side edge of the lens 2 horizontally, and the second positioning portion 412 may be a notch that is formed by means of recessing one face of the plastic body 41 inwardly. Via the above arrangement, the first positioning portion 21 can be engaged into the second positioning portion 412, that is, the protruding block 21 can be engaged in the notch 412. As a result, the lens 2 and the LED unit 40 can be positioned and assembled with each other firmly. Alternatively, both the protruding block and the notch can be interchangeably formed in the plastic body and the lens (not shown). That is, the top face of the plastic body is formed with protruding blocks by means of protruding upwardly, while the bottom face of the lens is formed with notches by means of recessing upwardly. With the protruding blocks being engaged in the notches of the lens, the same effect can be achieved.

Figure 7:
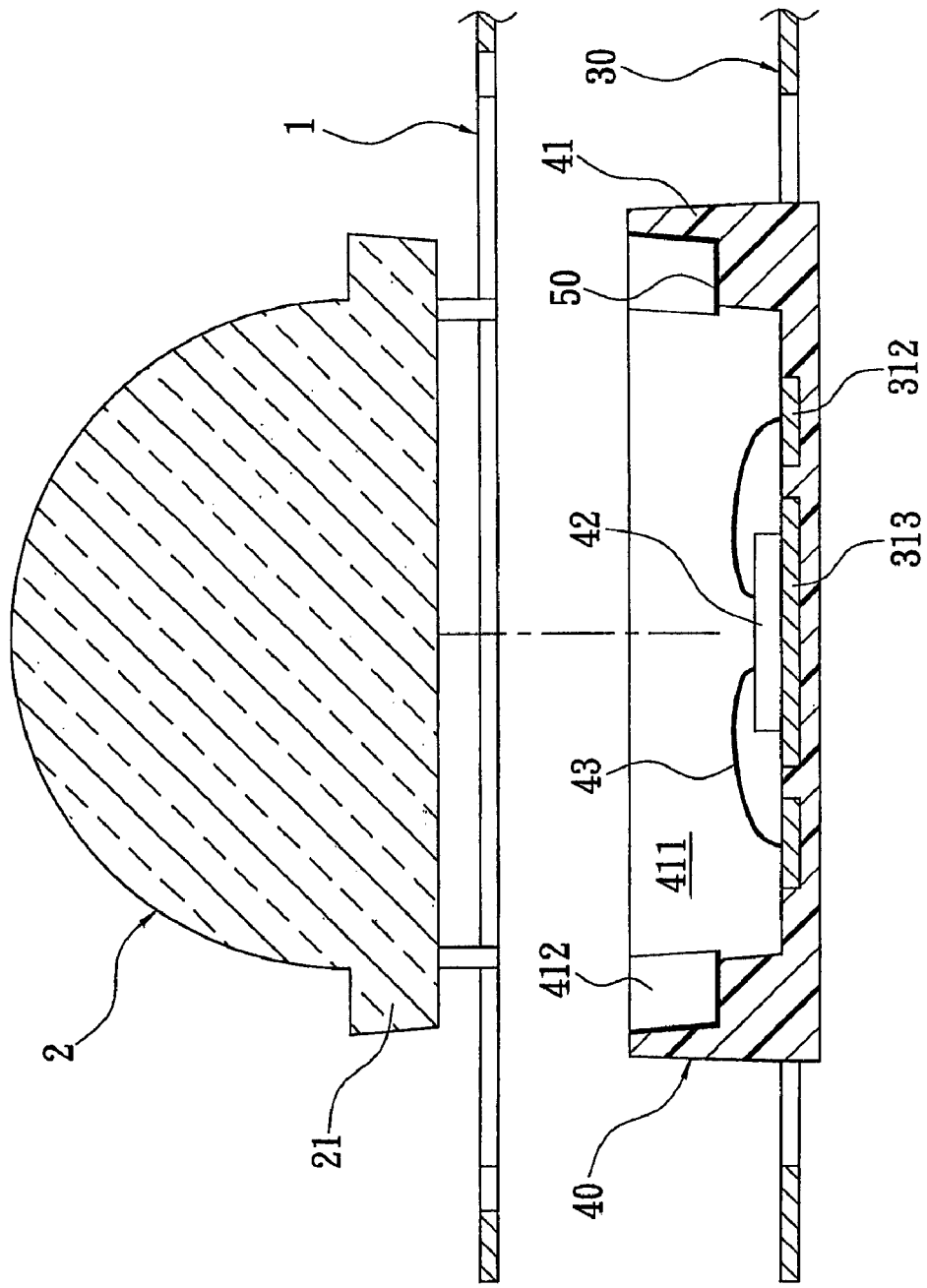
FIG. 7 is an exploded plan view showing the plate, the lens and the substrate of an LED of the present invention.

Further, the manufacturing method of the present invention comprises an adhesive-dotting step (E) after or before the step (D), in which the adhesive 50 is formed manually or mechanically on the plastic body 41 of each LED unit 40. Via the adhesive 50, each lens 2 can be adhered firmly on the plastic body 41 (FIG. 7).

More specifically, if the adhesive-dotting process is performed before the step (D), the adhesive 50 can be suitably dotted on/in the plastic body 41 of the LED unit 40 (such as the functional area 411). Then, before the adhesive 50 is cured, the plate 1 and the substrate 3 of LEDs are combined with each other, thereby assembling the LED unit 40 with the lens 2. When the adhesive 50 is cured, the lens 2 can be adhered on the LED unit 40 firmly without the possibility of detaching.

If the adhesive-dotting process is performed after the step (D), when the plate 1 and the substrate 3 of LEDs are combined with each other, the adhesive 50 can be suitably dotted on the positions in which the plastic body 41 and the lens 2 are combined with each other. After the adhesive 50 is cured, the lens 2 can be adhered on the LED unit 40 firmly.

Figure 8:
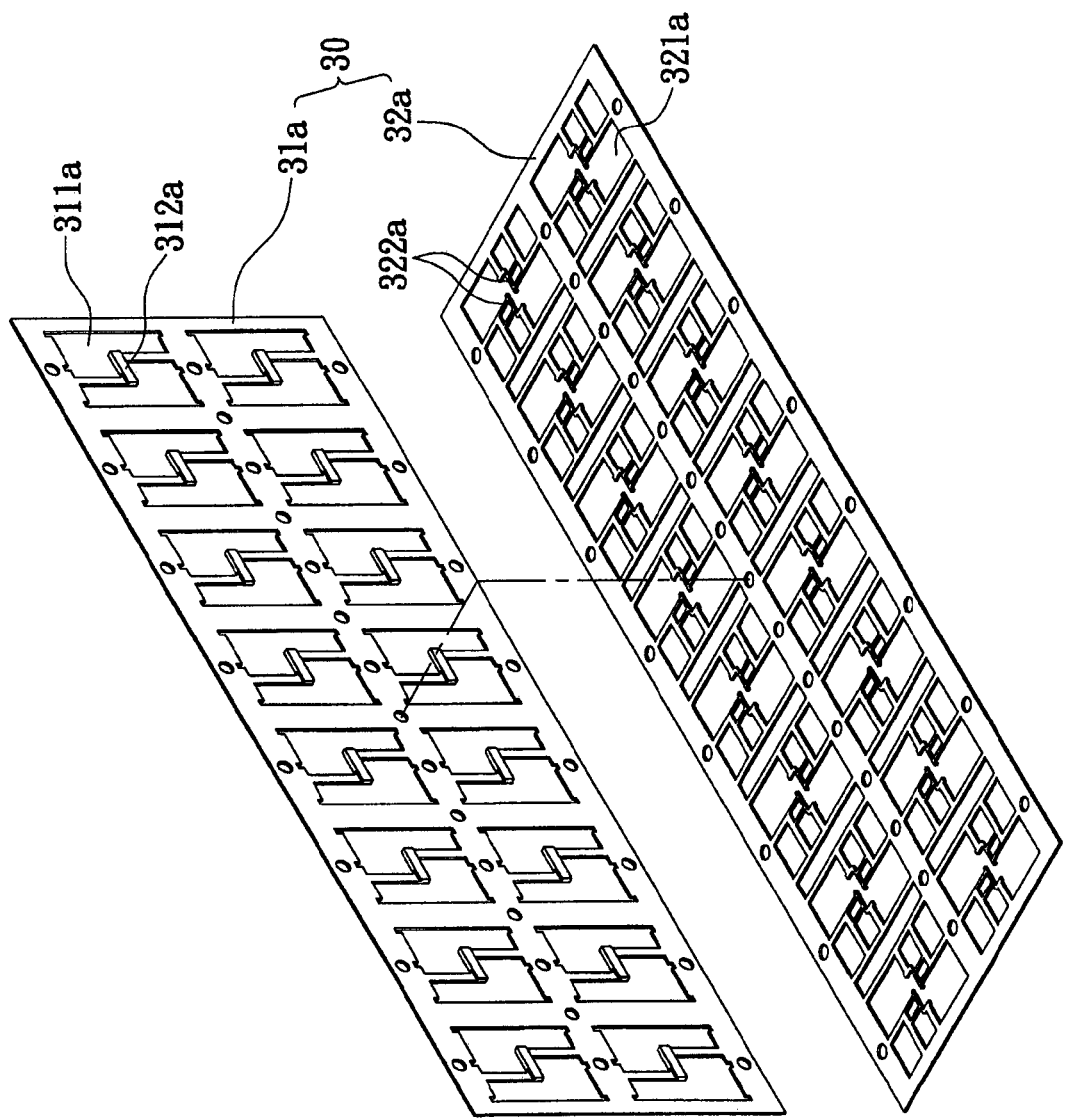
FIG. 8 is an exploded perspective view showing the substrate of LEDs of a further embodiment of the present invention.
Figure 9:
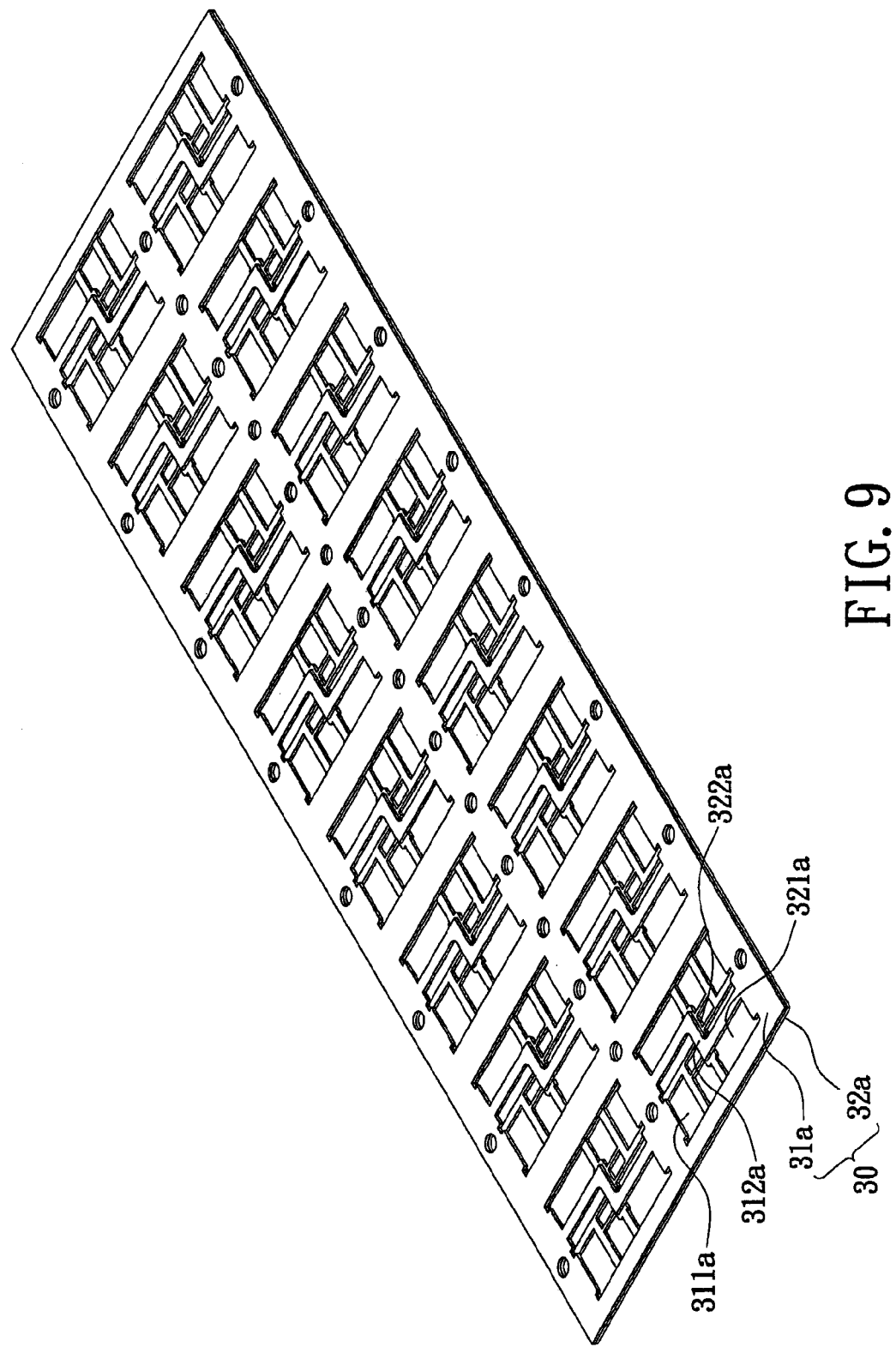
FIG. 9 is an assembled perspective view showing the substrate of LEDs of the further embodiment of the present invention.
Figure 10:
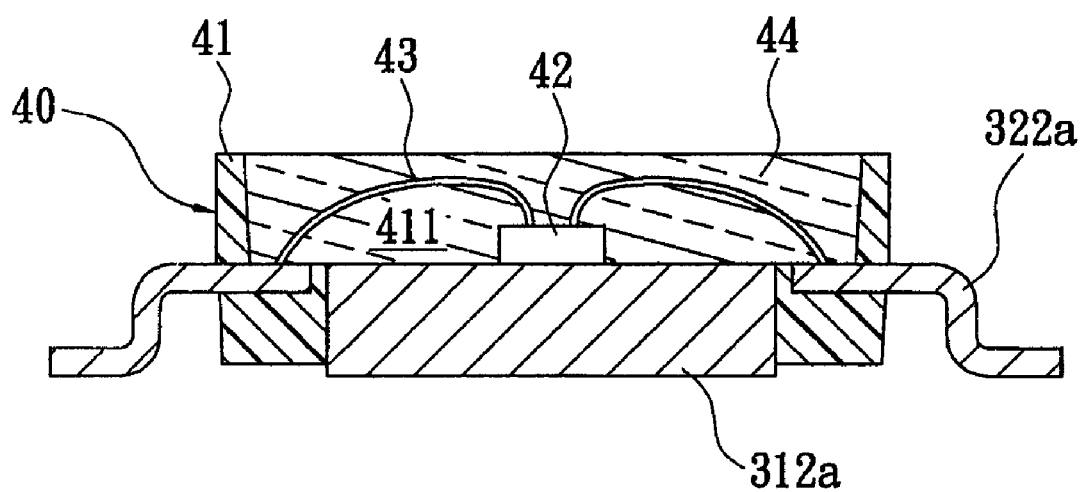
FIG. 10 is a cross-sectional view showing the substrate of an LED of the further embodiment of the present invention.

Incidentally, with reference to FIGS. 1, 8 and 10, the metallic plate unit 30 provided by the step (C) can be constituted by multiple pieces of metallic plates (i.e., at least two) and formed by the following steps.

(I) A press-forming process in which a first metallic plate 31a is formed with a plurality of first lead regions 311a, and each first lead region 311a is connected with a chip-fixing base 312a therein.

(II) A press-forming process in which a second metallic plate 32a is formed with a plurality of second lead regions 321a, and each second lead region 321a has a plurality of metallic supports 322a that do not communicate with one another. The number of the metallic supports can be set according to the practical demands, such as two, four or six.

(III) A combining process in which the first metallic plate 31a and the second metallic plate 32a are combined with each other, so that both the first lead region 311a and the second lead region 321a are combined correspondingly with each other. As a result, each of the chip-fixing base 312a and the corresponding metallic support 322a are arranged at an interval without communicating with each other.

(VI) An injection-forming process in which an insulating plastic body 41 is injected to connect the chip-fixing base 312a and the metallic supports 322a simultaneously in a manner the same as that described in the above embodiment. One face of each plastic body 41 is also formed with a recessed functional area 411, and the top face of the chip-fixing base 312a is exposed to the functional area 411. Each metallic support 322a is also formed by means of extending outwardly from the functional area 411 to the outside of the plastic body 41. The bottom face of the chip-fixing base 312a is exposed to the outside of the bottom of the plastic body 41. That is to say, the opposite two faces (a top face and a bottom face) of the chip-fixing base 312a are exposed to the outside of the functional area 411 and the plastic body 41 respectively.

(V) A chip-fixing process in which the top face of the chip-fixing base 312a is firmly connected with the LED chips 42. The number of LED chips can be set according to practical demands, such as three chips emitting different colors of light (R, G, B). Therefore, the number of the metallic supports 322a can be six.

(VI) A wiring process in which each LED chip 42 is connected with two wires 43 thereon, and the two wires 43 are connected to the two corresponding metallic supports 322a respectively.

Via the above steps, another kind of substrate 3 of LEDs can be formed, in which the metallic plate unit 30 has a plurality of LED units 40 therein. Each LED unit 40 comprises a plastic body 41, a plurality of metallic supports 322a, a chip-fixing base 312a, at least one LED chip 42, and the wires 43. The chip-fixing base 312a and the metallic support 322a are formed of the first and second metallic plates 31a, 32a of the metallic plate unit 30. Further, after the wiring process, an additional process may be performed.

(VII) A sealing process in which the functional area 411 of each plastic body 41 is filled with a transparent sealant layer 44, such as epoxy resin, silicon or any known thermoplastic resin, thereby covering the LED chip 42 and the wires 43.

According to the above step (VII), the substrate 3 of LEDs can be formed with each LED unit 40 further including a sealant layer 44.

Therefore, via the above steps, the structure of a supporting assembly of the present invention can be formed to include the plate 1 and the substrate 3 of LEDs. The plate 3 has the supporting areas 11, the supporting legs 12, and the lenses 2. The substrate 3 of LEDs has the metallic plate unit 30 and the LED unit 40. Naturally, the metallic plate unit 30 and the LED unit 40 have the above structure.

According to the above description, the plate 1 is formed therein with a great number of lenses 2 so that the plate 1 can be combined on the metallic plate unit 30 of the substrate 3 of LEDs. Therefore, mass produced lenses 2 can be assembled with and positioned on the corresponding LED units 40 at the same time. As a result, the processes are modified and the production rate is increased. Also, the defection ratio of the manufacturing procedure is substantially reduced.

Next, the lens 2 of the present invention is made of silicon, which has a property of withstanding high temperatures (over 260° C.). Therefore, the lens can be prevented from generating a substantial change in quality to lower the efficiency of the LED unit 40 due to the influence of high temperatures. In other words, the light-condensing effect of the lens 2 can be prevented from deteriorating due to the influence of high temperatures. Further, when the lens 2 is a solid body, the light-condensing effect of the LED unit 40 can be enhanced. Alternatively, when the lens is a hollow body, the light-condensing effect of the LED unit 40 can be reduced more easily.

Although the present invention has been described with reference to the foregoing preferred embodiments, it will be understood that the invention is not limited to the details thereof. Various equivalent variations and modifications may occur to those skilled in this art in view of the teachings of the present invention. Thus, all such variations and equivalent modifications are also embraced within the scope of the invention as defined in the appended claims.

What is claimed is:

1. A manufacturing method of a supporting assembly of a surface mount device LED, comprising the steps of:
    providing a plate for supporting a plurality of lenses, the plate being formed with a plurality of supporting areas;
    forming a plurality of lenses to be disposed respectively at the supporting areas of the plate and connected to the plate by a plurality of supporting legs;
    providing a substrate of LEDs wherein the substrate comprises a metallic plate unit, a plurality of surface mount device LED units each being formed on the metallic plate unit; and
    combining the plate having the lenses connected thereto with the substrate of LEDs, the plate being combined with the metallic plate unit to collectively align the lenses over corresponding ones of the LED units.

2. The manufacturing method of a supporting assembly of a surface mount device LED according to claim 1, wherein the plate is a metallic piece that is formed with each supporting area by means of a pressing process, and each supporting area is formed therein with corresponding supporting legs.

3. The manufacturing method of a supporting assembly of a surface mount device LED according to claim 2, wherein each of the lenses is connected to the corresponding supporting legs.

4. The manufacturing method of a supporting assembly of a surface mount device LED according to claim 1, wherein each of the lenses is connected into each supporting area firmly by means of an injection forming process.

5. The manufacturing method of a supporting assembly of a surface mount device LED according to claim 1, wherein the metallic plate unit is a metallic plate, and the LED unit comprises:
    a plurality of metallic supports formed by means of pressing the metallic plate;
    a plastic body connected to the metallic supports firmly by means of the injection forming process, one face thereof having a recessed functional area, wherein the metallic supports are extending outwardly from the functional area to the outside of the plastic body, the plastic body being combined with the lens; and
    at least one LED chip connected on the metallic support of the functional area firmly, wherein each the LED chip has wires to be connected to the metallic support.

6. The manufacturing method of a supporting assembly of a surface mount device LED according to claim 5, wherein the functional area of the plastic body further has a transparent sealant layer that covers the LED chip and the wires.

7. The manufacturing method of a supporting assembly of a surface mount device LED according to claim 1, wherein the metallic plate unit has a first metallic plate and a second metallic plate, the first and the second metallic plates are combined with each other, and each of the LED units comprises:
    a chip-fixing base formed by means of pressing the first metallic plate;
    a plurality of metallic supports formed by means of pressing the second metallic plate, wherein the chip-fixing base is separated from the metallic supports after combining the first metallic plate and the second metallic plate;
    a plastic body connecting the chip-fixing base and the metallic supports by means of the injection forming process, one face thereof having a recessed functional area, wherein the top face of the chip-fixing base is exposed to the functional area, the metallic supports are extending outwardly from the functional area to the outside of the plastic body, the plastic body is combined with the lens; and
    at least one LED chip firmly connected to the top face of the chip-fixing base, the LED chip having wires to be connected to the metallic support.

8. The manufacturing method of a supporting assembly of a surface mount device LED according to claim 7, wherein the functional area of the plastic body further has a transparent sealant layer that covers the LED chip and the wires.

9. The manufacturing method of a supporting assembly of a surface mount device LED according to claim 1, further including a step of dotting an adhesive to the LED units prior to the step of combining the plate with the substrate of an LED, wherein the adhesive firmly connects the lens with the LED unit after combining the LED unit with the lens.

10. The manufacturing method of a supporting assembly of a surface mount device LED according to claim 1, further including a step of dotting an adhesive to the LED units after the step of combining the plate with the substrate of an LED, wherein the adhesive is dotted at the positions in which the LED unit is combined with the lens, thereby firmly connecting the lens to the LED unit.

11. A structure of a supporting assembly of a surface mount device LED, including:
    a plate having a plurality of supporting areas and a plurality of lenses each positioned in the supporting areas, the lenses being connected to the plates by a plurality of supporting legs; and
    a substrate of LEDs having a metallic plate unit and a plurality of a surface mount device LED unit each formed on the metallic plate unit;
    wherein the plate having the lenses connected thereto is coupled to the metallic plate unit, the lenses being thereby collectively aligned over corresponding ones of the LED units.

12. The structure of a supporting assembly of a surface mount device LED according to claim 11, wherein each of the supporting areas has corresponding supporting legs that are integrally connected with the plate, and each of the lenses is connected to the corresponding supporting legs firmly.

13. The structure of a supporting assembly of a surface mount device LED according to claim 11, wherein the lenses are made of silicon.

14. The structure of a supporting assembly of a surface mount device LED according to claim 11, wherein the lenses are solid bodies.

15. The structure of a supporting assembly of a surface mount device LED according to claim 11, wherein each of the LED units comprises:
- a plastic body having a recessed functional area on one face thereof, the plastic body being combined with the lens;
- a plurality of metallic supports firmly connected in the plastic body in such a manner that they do not communicate with one another and extend outwardly from the functional area to the outside of the plastic body, the metallic supports being formed of the metallic plate unit; and
- at least one LED unit firmly connected on the metallic supports of the functional area, the LED chip having wires to be connected to the metallic support.

16. The structure of a supporting assembly of a surface mount device LED according to claim 15, wherein the functional area of the plastic body further has a transparent sealant layer that covers the LED chip and the wires.

17. The structure of a supporting assembly of a surface mount device LED according to claim 11, wherein each of the LED units comprises:
- a plastic body having a recessed functional area on one face thereof, the plastic body being combined with the lens;
- a chip-fixing base firmly connected in the plastic body, the top face of the chip-fixing base being exposed to the functional area, the chip-fixing base being formed of the metallic plate unit;
- a plurality of metallic supports firmly connected in the plastic body in such a manner that they do not communicate with one another and extend outwardly from the functional area to the outside of the plastic body, the metallic supports being separated from the chip-fixing base and being formed of the metallic plate unit; and
- at least one LED unit firmly connected to the top face of the chip-fixing base, the LED chip having wires to be connected to the metallic supports.

18. The structure of a supporting assembly of a surface mount device LED according to claim 17, wherein the functional area of the plastic body further has a transparent sealant layer that covers the LED chip and the wires.

19. The structure of a supporting assembly of a surface mount device LED according to claim 17, wherein the bottom face of the chip-fixing base is exposed to the outside of the plastic body.

20. The structure of a supporting assembly of a surface mount device LED according to claim 11, wherein an adhesive is applied to the connecting positions of the LED units and the lenses, and the adhesive allows the lens to be firmly connected to the LED unit.

* * * * *